(12) United States Patent
Kim et al.

(10) Patent No.: US 10,873,056 B2
(45) Date of Patent: Dec. 22, 2020

(54) ORGANIC LIGHT-EMITTING DISPLAY APPARATUS

(71) Applicant: SAMSUNG DISPLAY CO., LTD., Yongin-si (KR)

(72) Inventors: Dalho Kim, Yongin-si (KR); Heeseong Jeong, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 288 days.

(21) Appl. No.: 15/869,886

(22) Filed: Jan. 12, 2018

(65) Prior Publication Data
US 2018/0205040 A1    Jul. 19, 2018

(30) Foreign Application Priority Data

Jan. 19, 2017 (KR) .................. 10-2017-0009374

(51) Int. Cl.
*H01L 51/52* (2006.01)
*H01L 27/32* (2006.01)
*H01L 51/50* (2006.01)

(52) U.S. Cl.
CPC ...... *H01L 51/5278* (2013.01); *H01L 27/3213* (2013.01); *H01L 27/3267* (2013.01); *H01L 27/3269* (2013.01); *H01L 51/5012* (2013.01); *H01L 51/5206* (2013.01); *H01L 51/5221* (2013.01); *H01L 51/5265* (2013.01); *H01L 27/3218* (2013.01); *H01L 2251/558* (2013.01)

(58) Field of Classification Search
CPC ............. H01L 51/5278; H01L 27/3213; H01L 27/3267; H01L 27/3269; H01L 51/5012; H01L 51/5206; H01L 51/5221; H01L 51/5265; H01L 27/3218
See application file for complete search history.

(56) References Cited

U.S. PATENT DOCUMENTS

| | | | |
|---|---|---|---|
| 9,013,094 B2 | 4/2015 | Chang et al. | |
| 2013/0301278 A1* | 11/2013 | Choi | H01L 51/5265 362/296.04 |
| 2015/0069341 A1* | 3/2015 | Kim | H01L 27/3267 257/40 |
| 2017/0098686 A1 | 4/2017 | Jeong et al. | |

FOREIGN PATENT DOCUMENTS

| | | |
|---|---|---|
| JP | 2005-347072 A | 12/2005 |
| KR | 10-2013-0060006 A | 6/2013 |
| KR | 10-2015-0019347 A | 2/2015 |
| KR | 10-2015-0061558 A | 6/2015 |

* cited by examiner

*Primary Examiner* — Changhyun Yi
(74) *Attorney, Agent, or Firm* — Lewis Roca Rothgerber Christie LLP

(57) ABSTRACT

An organic light-emitting display apparatus includes a first light emitter having a resonance structure and a second light emitter having a non-resonance structure. The first light emitter and the second light emitter are to emit light of a same color. The resonance structure includes a reflective electrode and a semi-transmissive electrode. The non-resonance structure includes a reflective electrode and a transparent electrode. The first light emitter and the second light emitter are independently driven based on signals from different drivers.

19 Claims, 13 Drawing Sheets

ORGANIC LIGHT-EMITTING DISPLAY APPARATUS

CROSS-REFERENCE TO RELATED APPLICATION

Korean Patent Application No. 10-2017-0009374, filed on Jan. 19, 2017, and entitled, "Organic Light-Emitting Display Apparatus," is incorporated by reference herein in its entirety.

BACKGROUND

1. Field

One or more embodiments described herein relate to an organic light-emitting display apparatus.

2. Description of the Related Art

An organic light-emitting display apparatus may include an organic light-emitting device having an organic emission layer between a hole injection electrode and a electron injection electrode. The organic light emitting device is a self-emission type device that generates light when excitons transition from an excited state to a ground state. The excitons are generated when holes injected from the hole injection electrode and electrons injected from the electron injection electrode combine in the organic emission layer.

Since an organic light-emitting display apparatus does not require a separate light source (e.g., a backlight), it may be driven at low voltage and may be light in weight and thin. Also, an organic light-emitting display apparatus has excellent characteristics (such as a viewing angle, contrast, and response speed), and therefore has been used in MP3 players, mobile phones, televisions, and other electronic devices.

An organic light-emitting display apparatus may also have a wide light-emitting wavelength. Thus, emission efficiency may decrease and color purity may deteriorate over time. Also, since light emitted from the organic emission layer does not have certain directivity, a large amount of photons emitted in an arbitrary direction may not reach an actual observer, due to internal total reflection of the organic light-emitting device. As a result, light extraction efficiency of the organic light-emitting device may decrease.

In an attempt to increase light efficiency, an organic light-emitting display apparatus has been proposed that uses a microcavity structure. However, when a resonance structure is applied to the organic light-emitting display apparatus, light efficiency may increase, but luminance may be deteriorated at a side viewing angle. Also, a color shift may be generated.

SUMMARY

In accordance with one or more embodiments, an organic light-emitting display apparatus includes a display panel including a main surface where an image is displayed based on light from a plurality of pixels, wherein each of the pixels includes: a first driver and a second driver; a first organic light-emitting device electrically connected to the first driver, the first organic light-emitting device including a first pixel electrode, a first organic emission layer on the first pixel electrode, and a first counter electrode on the first organic emission layer; and a second organic light-emitting device electrically connected to the second driver, the second organic light-emitting device including a second pixel electrode, a second organic emission layer on the second pixel electrode and to emit a same color light as the first organic emission layer, and a second counter electrode on the second organic emission layer, wherein one of the first pixel electrode and the first counter electrode is a reflective electrode and the other one is a semi-transmissive electrode, and wherein one of the second pixel electrode and the second counter electrode is a reflective electrode and the other one is a transparent electrode.

The first counter electrode and the second counter electrode may be reflective electrodes, the first pixel electrode is a semi-transmissive electrode may include a transparent conductive layer and a semi-transmissive metal layer, and the second pixel electrode may be a transparent electrode including a transparent conductive layer. The first pixel electrode and the second pixel electrode may be reflective electrodes, the first counter electrode may be a semi-transmissive electrode including a transparent conductive layer and a semi-transmissive metal layer, and the second counter electrode may be a transparent electrode including a transparent conductive layer.

The transparent conductive layer may be shared by the first counter electrode and the second counter electrode, and the semi-transmissive metal layer may be in the first counter electrode and not in the second counter electrode. The first organic light-emitting device and the second organic light-emitting device may be independently driven by the first driver and the second driver, respectively.

The display apparatus may include a sensor, outside the display panel, to detect a location of a user; and a controller to control turning on/off or intensity of each of the first organic light-emitting device and the second organic light-emitting device in each of the plurality of pixels, based on the location of the user detected by the sensor. The controller may include a viewing angle calculator to calculate a viewing angle of the user with respect to the main surface based on the location of the user detected by the sensor.

The controller may control the first and second organic light-emitting devices such that intensity of light emitted from the first organic light-emitting device is greater than that from the second organic light-emitting device when the viewing angle is above a predetermined reference value.

The controller may control the first and second organic light-emitting devices such that the number of first organic light-emitting devices that are turned on is greater than the number of second organic light-emitting devices when the viewing angle is above a predetermined reference value.

The display apparatus as claimed in claim 1 may include a first lower functional layer between the first pixel electrode and the first organic emission layer; and a second lower functional layer between the second pixel electrode and the second organic emission layer, wherein thicknesses of the first lower functional layer and the second lower functional layer are different from each other.

The display apparatus may include a first upper functional layer between the first organic emission layer and the first counter electrode; and a second upper functional layer between the second organic emission layer and the second counter electrode, wherein thicknesses of the first upper functional layer and the second upper functional layer are different from each other.

In accordance with one or more other embodiments, an organic light-emitting display apparatus includes a display panel including a main surface where an image is displayed based on light emitted from a plurality of pixels, wherein each of the pixels includes a plurality of sub-pixels to emit different colors of light, each of the sub-pixels including: a first organic light-emitting device having a resonance structure including a reflective electrode and a semi-transmissive electrode; and a second organic light-emitting device having a non-resonance structure including a reflective electrode and a transparent electrode, and the first organic light-emitting device and the second organic light-emitting device are to be independently driven.

The first organic light-emitting device and the second organic light-emitting device respectively may include a first organic light emission layer and a second organic emission layer to emit a same color light.

The display apparatus may include a sensor, outside the display panel, to detect a location of a user; and a controller to control turning on/off or intensity of each of the first organic light-emitting device and the second organic light-emitting device in each of the plurality of sub-pixels, based on the location of the user detected by the sensor. The controller may include a viewing angle calculator to calculate a viewing angle of the user with respect to the main surface based on the location of the user detected by the sensor.

The controller may control the first and second organic light-emitting devices such that intensity of light emitted from the first organic light-emitting device is greater than that from the second organic light-emitting device when the viewing angle is above a predetermined reference value. The controller may control the first and second organic light-emitting devices such that the number of first organic light-emitting devices that are turned on is greater than the number of second organic light-emitting devices when the viewing angle is above a predetermined reference value.

In accordance with one or more other embodiments, an apparatus includes a first light emitter having a resonance structure; and a second light emitter having a non-resonance structure, wherein the first light emitter and the second light emitter are to emit light of a same color. The resonance structure may include a reflective electrode and a semi-transmissive electrode and the non-resonance structure may include a reflective electrode and a transparent electrode. The first light emitter and the second light emitter may be independently driven based on different signals from different drivers.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
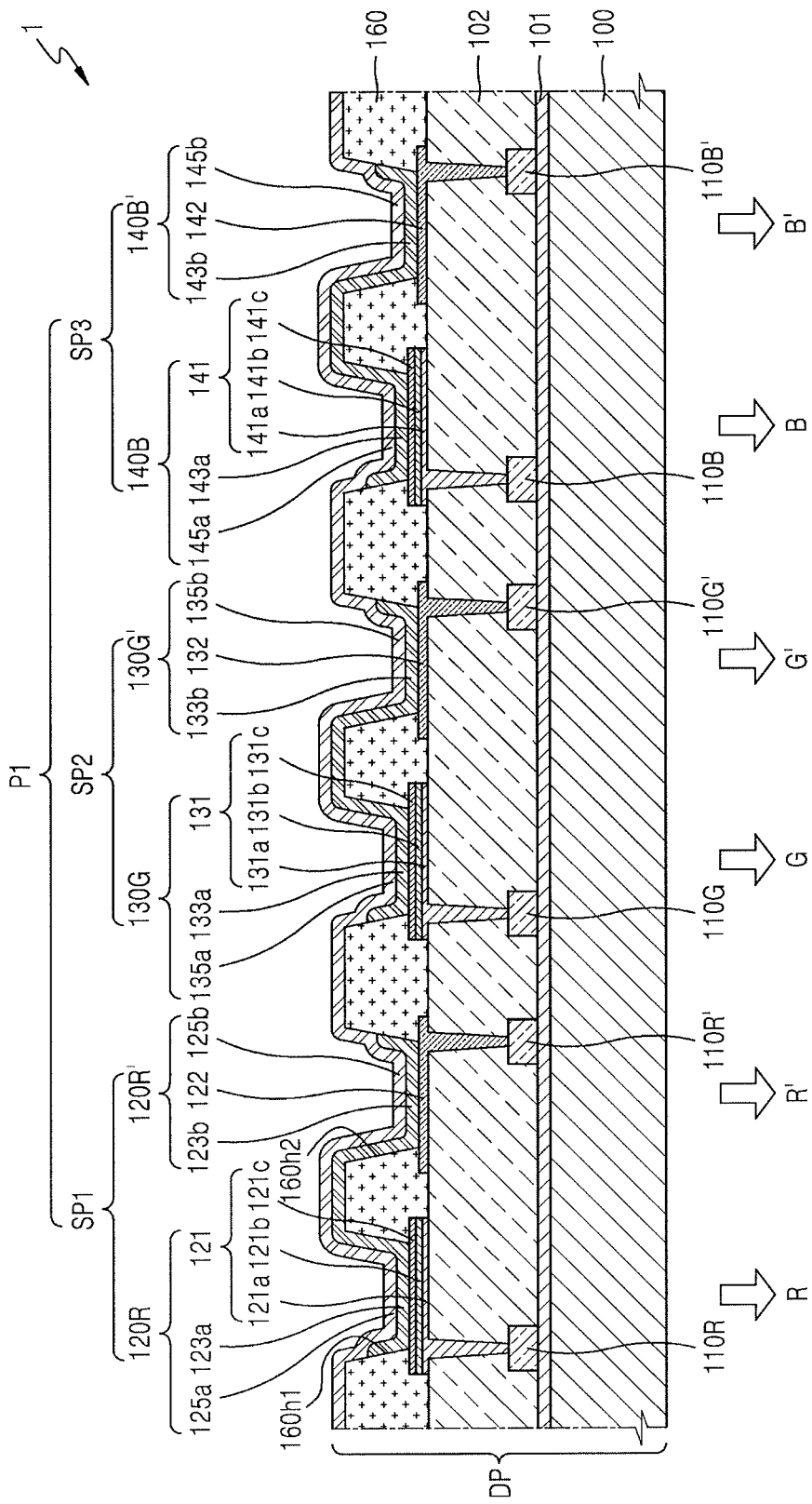
FIG. 1 illustrates an embodiment of an organic light-emitting display apparatus.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light-emitting display apparatus 1 which includes a display panel DP including a plurality of pixels P1. Each of the pixels P1 includes a plurality of sub-pixels (e.g., first through third sub-pixels SP1 through SP3) emitting different colors of light. The organic light-emitting display apparatus 1 displays an image based on light emitted from the first to third sub-pixels SP1 to SP3 of each of the pixels P1.

In FIG. 1, one pixel P1 including the first to third sub-pixels SP1 to SP3 of the organic light-emitting display apparatus 1. The pixel P1 includes the first sub-pixel SP1, the second sub-pixel SP2, and the third sub-pixel SP3 respectively emitting red, green, and blue light. In another embodiment, the pixel P1 may include a different number of sub-pixels and/or the sub-pixels may emit one or more different colors of light.

Referring to FIG. 1, the organic light-emitting display apparatus 1 includes a first driving unit 110R, a second driving unit 110R', and a first organic light-emitting device (OLED) 120R and a second OLED 120R' respectively electrically connected to the first driving unit 110R and the second driving unit 110R'. The first OLED 120R has a resonance structure including a reflective electrode and a semi-transmissive electrode. The second OLED 120R' has a non-resonance structure including a reflective electrode and a transparent electrode.

The first and second driving units 110R and 110R' may be over a substrate 100. A buffer layer 101 may be between the substrate 100 and the first and second driving units 110R and 100R'. The buffer layer 101 planarizes a top surface of the substrate 100 and prevents infiltration of impurities from the substrate 100 into the first and second driving units 110R and 110R'.

A planarization layer 102 is on the buffer layer 101 and covers the first and second driving units 110R and 110R'. The planarization layer 102 may be a single layer or multi-layer of an inorganic material and/or an organic material. Each of the first and second driving units 110R and 110R' may include various devices, e.g., thin-film transistors (TFTs) and a capacitor.

The first OLED 120R having the resonance structure and the second OLED 120R' having the non-resonance structure are on the planarization layer 102. The first and second OLEDs 120R and 120R' may be independently driven respectively by the first and second driving units 110R and 110R'.

The first OLED 120R includes a first pixel electrode 121, a first organic emission layer 123a on the first pixel electrode 121, and a first counter electrode 125a on the first organic emission layer 123a. The first pixel electrode 121 may include a semi-transmissive electrode and the first counter electrode 125a may include a reflective electrode.

According to an embodiment, the first pixel electrode 121 may include a semi-transmissive metal layer 121b and transparent conductive layers 121a and 121c below and on the semi-transmissive metal layer 121b, respectively. Each of the transparent conductive layers 121a and 121c may include at least one of indium tin oxide (ITO), indium zinc oxide (IZO), zinc oxide (ZnO), indium oxide ($In_2O_3$), indium gallium oxide (IGO), and aluminum zinc oxide (AZO). The semi-transmissive metal layer 121b may include at least one of silver (Ag), aluminum (Al), magnesium (Mg), lithium (Li), calcium (Ca), copper (Cu), LiF/Ca, LiF/Al, MgAg, and CaAg. For example, the first pixel electrode 121 may include a triple layer of ITO/Ag/ITO, where Ag may have a thin-film form with a thickness in a predetermined range (e.g., several to hundreds of angstrom (Å)) to show semi-transmissive characteristics.

A resonance structure may be between the first pixel electrode 121 including the semi-transmissive electrode and the first counter electrode 125a including the reflective electrode. The distance between the first pixel electrode 121 and the first counter electrode 125a may satisfy a constructive interference condition, so that light emitted from the first organic emission layer 123a may be repeatedly reflected at the first pixel electrode 121 and the first counter electrode 125a to have a small half-width and increased intensity. Light-extracting efficiency of the first OLED 120R may be increased with such a microcavity structure.

The second OLED 120R' may include a second pixel electrode 122, a second organic emission layer 123b on the second pixel electrode 122, and a second counter electrode 125b on the second organic emission layer 123b. The second pixel electrode 122 may include a transparent electrode, and the second counter electrode 125b may include a reflective electrode.

According to an embodiment, the second pixel electrode 122 may include a transparent conductive layer formed of, for example, ITO and may have transmittance of about 90% or higher. Since the second pixel electrode 122 includes the transparent electrode, light emitted from the second organic emission layer 123b may not travel between the second pixel electrode 122 and the second counter electrode 125b, but may be externally emitted directly or via the second pixel electrode 122 after reflection by the second counter electrode 125b.

When the first sub-pixel SP1 or the pixel P1 has a resonance structure in order to increase light-extracting efficiency, a phenomenon in which a wavelength of light emitted towards a front of an organic light-emitting display apparatus and a wavelength of light emitted towards a side of the organic light-emitting display apparatus are different from each other due to a path difference in the resonance structure, e.g., a color shift at a side viewing angle and luminance deterioration may be generated.

In this regard, when the resonance structure is not employed at all, color shift and luminance deterioration may not occur, but light-extracting efficiency of the organic light-emitting apparatus may largely decrease.

In the organic light-emitting display apparatus 1, the first sub-pixel SP1 or the pixel P1 includes both the first OLED 120R having the resonance structure and the second OLED 120R' having the non-resonance structure. As a result, light efficiency and viewing angle characteristics may be adjusted in balance by driving the first and second OLEDs 120R and 120R'. For example, by adjusting the number and intensity of each of the first OLED 120R and the second OLED 120R' that are turned on based on the location of the user viewing the organic light-emitting display apparatus 1, the user may view an image realized by the organic light-emitting display apparatus 1 under an optimum condition, as described below.

A pixel-defining layer 160 having a first opening 160h1 exposing at least a part of the first pixel electrode 121 and a second opening 160h2 exposing at least a part of the second pixel electrode 122 may be provided on the planarization layer 102. The pixel-defining layer 160 prevents generation of an arc at edges of the first and second pixel electrodes 121 and 122, by increasing the distances between the edges of the first and second pixel electrodes 121 and 122 and the first and second counter electrodes 125a and 125b. The pixel-defining layer 160 may include an organic material, for example, polyimide or hexamethyldisiloxane (HMDSO).

The first and second OLEDs 120R and 120R' respectively include the first and second organic emission layers 123a and 123b. The first and second organic emission layers 123a and 123b may include a material emitting the same color of light. In FIG. 1, the first and second organic emission layers 123a and 123b are connected to each other. In another embodiment, the first and second organic emission layers 123a and 123b may be separated from each other, but at this time as well the first and second organic emission layers 123a and 123b may be formed of the same material.

Each of the first and second counter electrodes 125a and 125b may include a reflective electrode, and may include at least one of Ag, Al, Mg, Li, Ca, Cu, LiF/Ca, LiF/Al, MgAg, and CaAg having a predetermined thickness such that reflectance is equal to or higher than a predetermined percentage, e.g., 90%. The first and second counter electrodes 125a and 125b may be connected to each other. For example, each of the first and second counter electrodes 125a and 125b may be part of a common electrode commonly provided throughout the first to third sub-pixels SP1 through SP3.

According to an embodiment, the organic light-emitting display apparatus 1 may include the first to third sub-pixels SP1 through SP3 to form the pixel P1. The second and third sub-pixels SP2 and SP3 emit different color light from the first sub-pixel SP1 described above.

The second and third sub-pixels SP2 and SP3 may include first OLEDs 130G and 140B having a resonance structure and driven by first driving units 110G and 110B, and second OLEDs 130G' and 140B' having a non-resonance structure and driven by second driving units 110G' and 110B', respectively.

The first OLEDs 130G and 140B may respectively include first pixel electrodes 131 and 141 having transparent conductive layers 131a, 131c, 141a, and 141c, and semi-transmissive metal layers 131b and 141b, first organic emission layers 133a and 143a, and first counter electrodes 135a and 145a. The second OLEDs 130G' and 140B' may respectively include second pixel electrodes 132 and 142 including transparent conductive layers, second organic emission layers 133b and 143b, and second counter electrodes 135b and 145b.

The first and second OLEDs 130G and 130G' in the second sub-pixel SP2 are independently driven. The first and second organic emission layers 133a and 133b may include materials emitting the same color of light. Similarly, the first and second OLEDs 140B and 140B' in the third sub-pixel SP3 are independently driven, and the first and second organic emission layers 143a and 143b may include materials emitting the same color of light.

Figure 2:
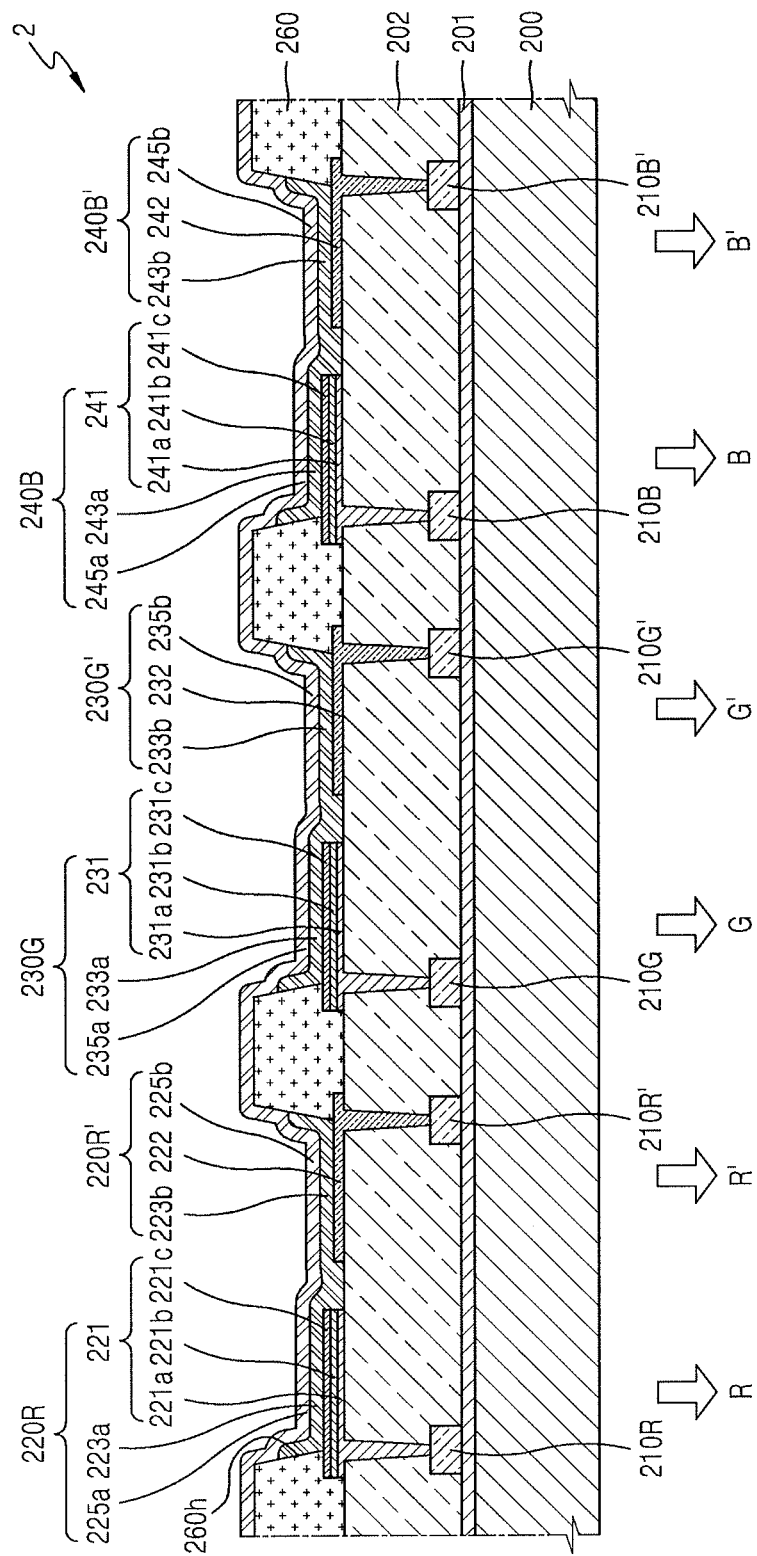
FIG. 2 illustrates another embodiment of an organic light-emitting display apparatus.

FIG. 2 illustrates a cross-sectional view of another embodiment of an organic light-emitting display apparatus 2. Referring to FIG. 2, the organic light-emitting display apparatus 2 may have the same structure as the organic light-emitting display apparatus 1 of FIG. 1, except for a pixel-defining layer 260.

The organic light-emitting display apparatus 2 includes first driving units 210R, 210G, and 210B, second driving units 210R', 210G', and 210B', and first OLEDs 220R, 230G, 240B and second OLEDs 220R', 230G', and 240B' respectively electrically connected to the first driving units 210R, 210G, and 210B and second driving units 210R', 210G', and 210B'. Each of the first OLEDs 220R, 230G, and 240B has a resonance structure including a reflective electrode and a semi-transmissive electrode. Also, each of the second OLEDs 220R', 230G', and 240B' may have a non-resonance structure including a reflective electrode and a transparent electrode.

For example, the first driving units 210R, 210G, and 210B, and the second driving units 210R', 210G', and 210B' are over a substrate 200. A buffer layer 201 may be between the substrate 200 and the first and second driving units 210R, 210G, 210B, 210R', 210G', and 210B'. A planarization layer 202 may be on the buffer layer 201 and covers the first driving units 210R, 210G, and 210B and the second driving units 210R', 210G', and 210B'.

The first OLEDs 220R, 230G, and 240B include first pixel electrodes 221, 231, and 241, first organic emission layers 223a, 233a, and 243a on the first pixel electrodes 221, 231, and 241, and first counter electrodes 225a, 235a, and 245a on the first organic emission layers 223a, 233a, and 243a. According to an embodiment, the first pixel electrodes 221, 231, and 241 may include semi-transmissive metal layers 221b, 231b, and 241b and transparent conductive layers 221a, 221c, 231a, 231c, 241a, and 241c provided below and on the semi-transmissive metal layers 221b, 231b, and 241b, respectively.

The second OLEDs 220R', 230G', and 240B' include second pixel electrodes 222, 232, and 242, second organic emission layers 223b, 233b, and 243b on the second pixel electrodes 222, 232, and 242, and second counter electrodes 225b, 235b, and 245b on the second organic emission layers 223b, 233b, and 243b.

The pixel-defining layer 260 has an opening 260h simultaneously exposing the first pixel electrode 221 and the second pixel electrode 222, and may be on the planarization layer 202. For example, the pixel-defining layer 160 of the organic light-emitting display apparatus 1 of FIG. 1 may have the first and second openings 160h1 and 160h2 respectively exposing the first and second pixel electrodes 121 and 122 in regions corresponding to the first sub-pixel SP1. However, the pixel-defining layer 260 of the organic light-emitting display apparatus 2 of FIG. 2 may only have one opening 260h simultaneously exposing the first and second pixel electrodes 221 and 222 in a region corresponding to one sub-pixel.

The pixel-defining layer 260 having the opening 260h may define one sub-pixel region. For example, the first OLED 220R having a resonance structure and the second OLED 220R' having a non-resonance structure may both be in the opening 260h.

The organic light-emitting display apparatuses 1 and 2 of FIGS. 1 and 2 may be bottom-emission type organic light-emitting display apparatuses, in which an image is displayed towards the substrates 100 and 200. Organic light-emitting display apparatuses 3 and 4 that are top-emission type organic light-emitting display apparatuses, in which an image is displayed towards first counter electrodes 325a and 425a and second counter electrodes 325b and 425b, will be described.

Figure 3:
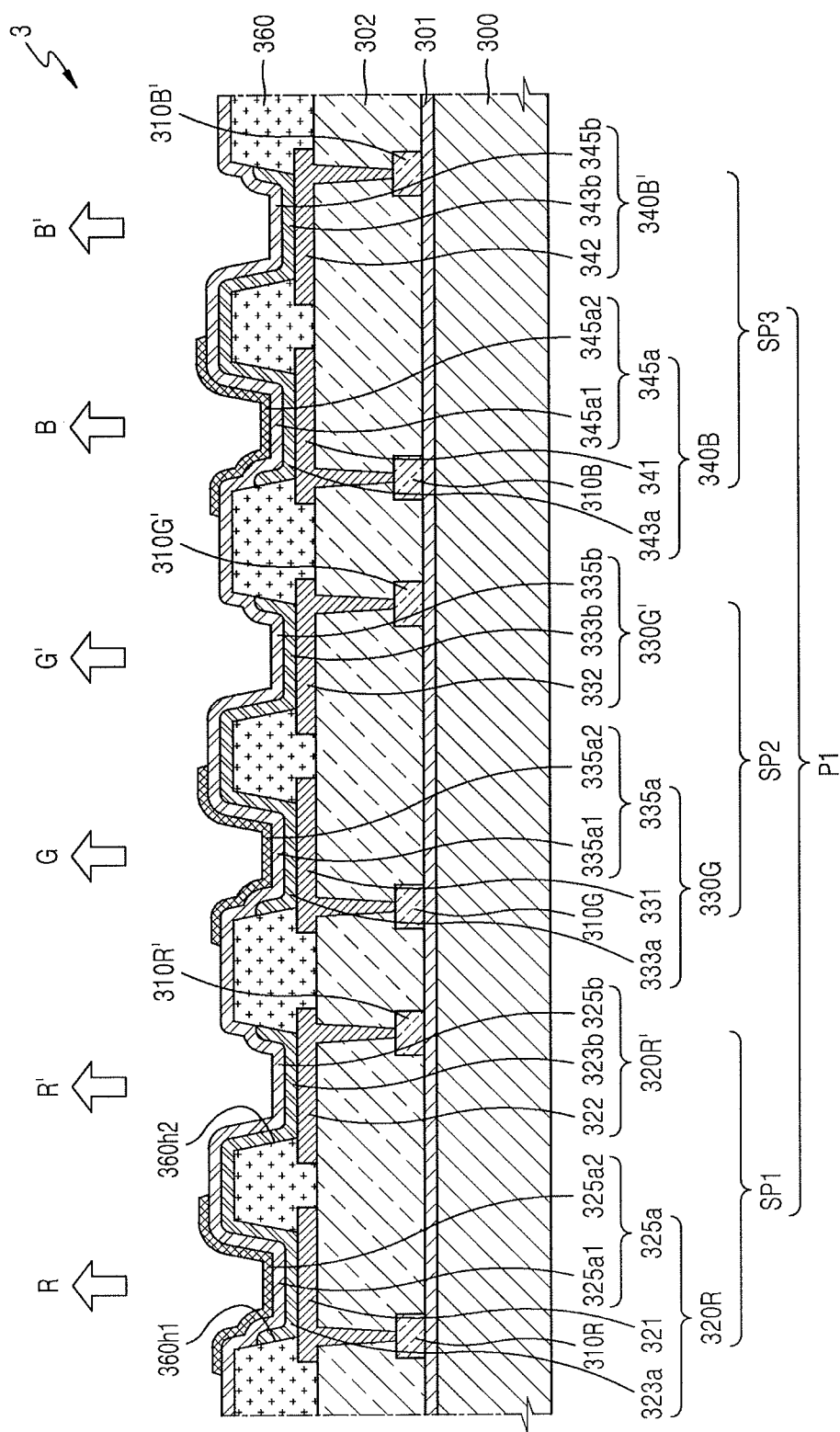
FIG. 3 illustrates another embodiment of an organic light-emitting display apparatus.

FIG. 3 illustrates a cross-sectional view of another embodiment of an organic light-emitting display apparatus 3. Referring to FIG. 3, the organic light-emitting display apparatus 3 includes a first driving unit 310R, a second driving unit 310R', and first and second OLEDs 230R and 230R' respectively electrically connected to the first driving unit 310R and the second driving unit 310R'. The first OLED 230R has a resonance structure including a reflective electrode and a semi-transmissive electrode. The second OLED 230R' has a non-resonance structure including a reflective electrode and a transparent electrode.

For example, the first and second driving units 310R and 310R' are over a substrate 300, and a buffer layer 301 may be between the substrate 300 and the first and second driving units 310R and 310R'. A planarization layer 302 covering the first and second driving units 310R and 310R' may be on the buffer layer 301.

The first OLED 320R having a resonance structure and the second OLED 320R' having a non-resonance structure may be on the planarization layer 302. The first and second OLEDs 320R and 320R' may be independently driven by the first and second driving units 310R and 310R', respectively.

The first OLED 320R includes a first pixel electrode 321, a first organic emission layer 323a on the first pixel electrode 321, and the first counter electrode 325a on the first organic emission layer 323a. The first pixel electrode 321 may include a reflective electrode and the first counter electrode 325a may include a semi-transmissive electrode.

According to an embodiment, the first pixel electrode 321 may include a reflective conductive layer including at least one of Ag, Al, Mg, Li, Ca, Cu, LiF/Ca, LiF/Al, MgAg, and CaAg, and may further include a transparent conductive layer provided on and/or below the reflective conductive layer. For example, the first pixel electrode 321 may include a triple layer of ITO/Ag/ITO. The reflective conductive layer may have a predetermined thickness to have a predetermined reflectance, e.g., about 90% or higher.

According to an embodiment, the first counter electrode 325a may include a transparent may include a transparent conductive layer 325a1 and a semi-transmissive metal layer 325a2 on the transparent conductive layer 325a1. In FIG. 3, the semi-transmissive metal layer 325a2 is over the transparent conductive layer 325a1, but may be below the transparent conductive layer 325a1 in one embodiment.

A resonance structure may be between the first pixel electrode 321 including a reflective electrode and the second counter electrode 325a including a semi-transmissive electrode. The distance between the first pixel electrode 321 and the first counter electrode 325a may satisfy a constructive interference condition, so that light emitted from the first organic emission layer 323a may be repeatedly reflected at the first pixel electrode 321 and the first counter electrode 325a to have a small half-width and increased intensity. Light-extracting efficiency of the first OLED 320R may be increased with such a microcavity structure.

The second OLED 320R' may include a second pixel electrode 322, a second organic emission layer 323b on the second pixel electrode 322, and the second counter electrode 325b on the second organic emission layer 323b. The second pixel electrode 322 may include a reflective electrode and the second counter electrode 325b may include a transparent electrode. According to an embodiment, the first pixel electrode 322 may have the same structure as the first pixel electrode 321.

The second counter electrode 325b may include a transparent conductive layer, which may be a layer shared by the first and second OLEDs 320R and 320R', and may be provided to be shared by the first and second counter electrodes 325a and 325b. The semi-transmissive metal layer 325a2 may only be in the first counter electrode 325a.

Since the second counter electrode 325b includes the transparent electrode, light emitted from the second organic emission layer 323b may not travel between the second pixel electrode 322 and the second counter electrode 325b, but may be externally emitted directly or via the second counter electrode 325b after reflection by the second pixel electrode 322.

In the organic light-emitting display apparatus 3, the first sub-pixel SP1 or the pixel P1 includes both the first OLED 320R having a resonance structure and the second OLED 320R' having a non-resonance structure. Light efficiency and viewing angle characteristics may be adjusted in balance by driving each of the first and second OLEDs 320R and 320R'.

A pixel-defining layer 360 having a first opening 360h1 exposing at least a part of the first pixel electrode 321 and a second opening 360h2 exposing at least a part of the second pixel electrode 322 may be on the planarization layer 302. The pixel-defining layer 360 prevents generation of an arc at edges of the first and second pixel electrodes 321 and 322, by increasing the distances between the edges of the first and second pixel electrodes 321 and 322 and the first and second counter electrodes 325a and 325b. The pixel-defining layer 360 may be include an organic material, e.g., polyimide or HMDSO.

The first and second OLEDs 320R and 320R' respectively include the first and second organic emission layers 323a and 323b. The first and second organic emission layers 323a and 323b may include a material emitting the same color of light.

According to an embodiment, the organic light-emitting display apparatus 3 may include the first through third sub-pixels SP1 to SP3 to form the pixel P1. The second and third sub-pixels SP2 and SP3 emit different colors of light from the first sub-pixel SP1 described above.

The second and third sub-pixels SP2 and SP3 may include first OLEDs 310G and 310B having a resonance structure and driven by first driving units 310G and 310B, and second OLEDs 330G' and 340B' having a non-resonance structure and driven by second driving units 310G' and 310B'.

The first OLEDs 330G and 340B may include first pixel electrodes 331 and 341 including reflective electrodes, first organic emission layers 333a and 343a, and first counter electrodes 335a and 345a including transparent conductive layers 335a1 and 345a1 and semi-transmissive metal layers 335a2 and 345a2. The second OLEDs 330G' and 340B' may include second pixel electrodes 332 and 342 including reflective electrodes, second organic emission layers 333b and 343b, and second counter electrodes 335b and 345b including transparent electrodes.

The first and second OLEDs 330G and 330G' in the second sub-pixel SP2 are independently driven, and the first and second organic emission layers 333a and 333b may include materials emitting the same color of light. Similarly, the first and second OLEDs 340B and 340B' in the third sub-pixel SP3 are independently driven, and the first and second organic emission layers 343a and 343b may include materials emitting the same color of light.

Figure 4:
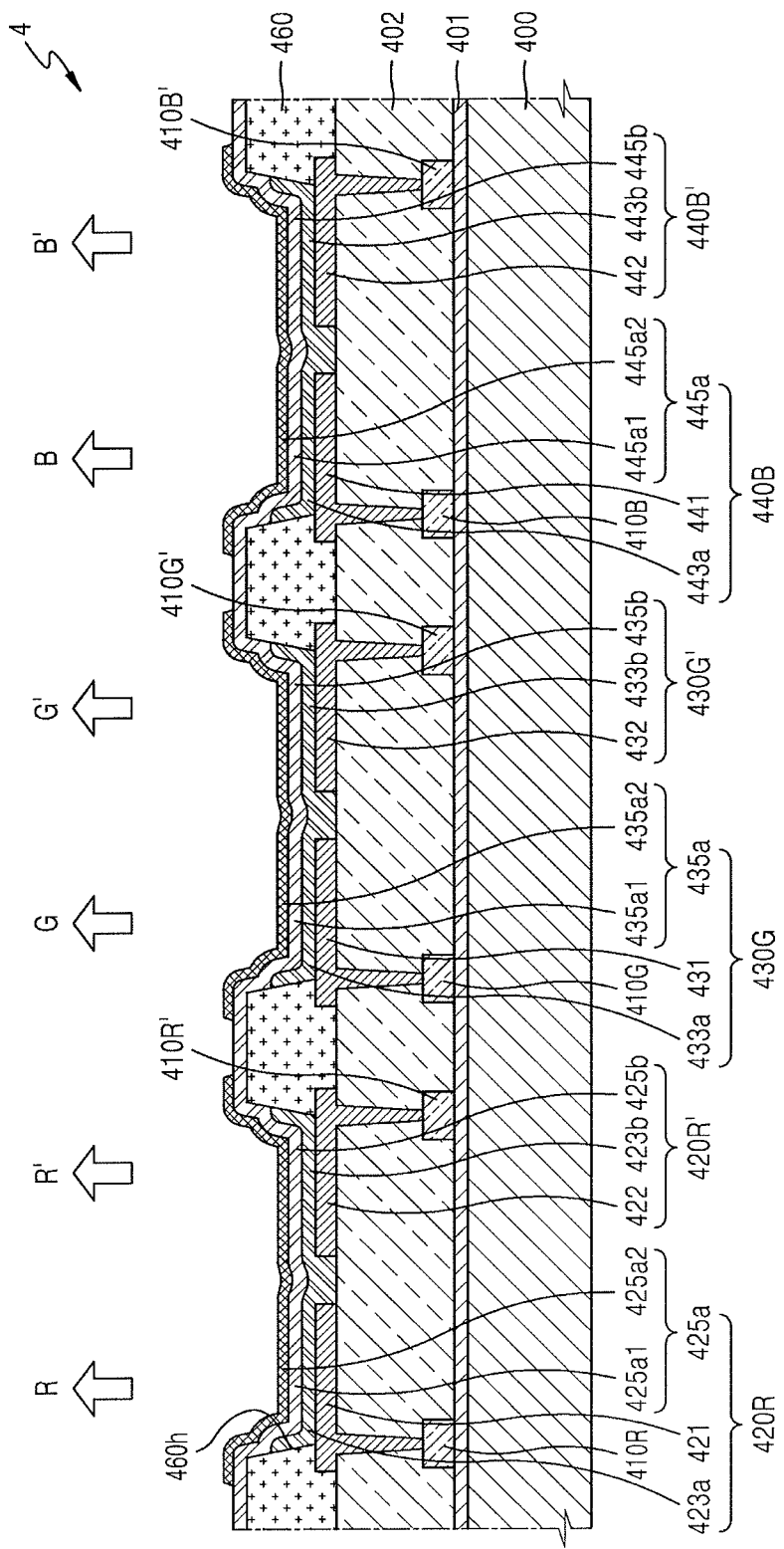
FIG. 4 illustrates another embodiment of an organic light-emitting display apparatus.

FIG. 4 illustrates a cross-sectional view of another embodiment of an organic light-emitting display apparatus 4. Referring to FIG. 4, the organic light-emitting display apparatus 4 may have the same structure as the organic light-emitting display apparatus 3 of FIG. 3, except for a pixel-defining layer 460.

The organic light-emitting display apparatus 4 includes first driving units 410R, 410G, and 410B, second driving units 410R', 410G', and 410B', and first OLEDs 420R, 430G, and 440B and the second OLEDs 420R', 430G', and 440B' respectively electrically connected to the first driving units 410R, 410G, and 410B and the second driving units 410R', 410G', and 410B'. Each of first OLEDs 420R, 430G, and 440B may have a resonance structure including a reflective electrode and a semi-transmissive electrode. Each of the second OLEDs 420R', 430G', and 440B' may have a non-resonance structure including a reflective electrode and a transparent electrode.

For example, the first driving units 410R, 410G, and 410B and the second driving units 410R', 410G', and 410B' are over a substrate 400, and a buffer layer 401 may be between the substrate 400 and the first and second driving units 410R, 410G, 410B, 410R', 410G', and 410B'. A planarization layer 402 covering the first and second driving units 410R, 410G, 410B, 410R', 410G', and 410B' may be on the buffer layer 401.

The first OLEDs 420R, 430G, and 440B include first pixel electrode 421, 431, and 441, first organic emission layers 423a, 433a, and 443a on the first pixel electrodes 421, 431, and 441, and first counter electrodes 425a, 435a, and 445a on the first organic emission layers 423a, 433a, and 443a. According to an embodiment, each of the first pixel electrodes 421, 431, and 441 includes a reflective conductive layer. Each of the first counter electrodes 425a, 435a, and 445a may include conductive layers 425a,1, 435a1, 445a1 and semi-transmissive metal layers 425a2, 435a2, and 445a2.

The second OLEDs 420R', 430G', and 440B' include second pixel electrodes 422, 432, and 442, second organic emission layers 423b, 433b, and 443b on the second pixel electrodes 422, 432, and 442, and second counter electrodes 425b, 435b, and 445b on the second organic emission layers 423b, 433b, and 443b.

The pixel-defining layer 460 has an opening 460h for simultaneously exposing a first pixel electrode 421 and a second pixel electrode 422. The pixel-defining layer 460 may be on the planarization layer 402. For example, the pixel-defining layer 360 of the organic light-emitting display apparatus 3 of FIG. 3 may include the first and second openings 360h1 and 360h2 that respectively expose the first and second pixel electrodes 321 and 322 at a region corresponding to one sub-pixel. However, the pixel-defining layer 460 of the organic light-emitting display apparatus 4 of FIG. 4 may include only one opening 460h for simultaneously exposing the first and second pixel electrodes 421 and 422 at a region corresponding to one sub-pixel.

The pixel-defining-layer 460 having the opening 460h may define one sub-pixel region. For example, the first OLED 420R having a resonance structure and the second OLED 420R' having a non-resonance structure may both be in the opening 460h.

FIGS. 5 to 8 are plan views illustrating embodiments of pixel structures of organic light-emitting display apparatuses 5 to 8. The organic light-emitting display apparatuses 5 and 6 of FIGS. 5 and 6 include the plurality of pixels P1, each of which include the first sub-pixel SP1, the second sub-pixel SP2, and the third sub-pixel SP3 emitting different color lights. The first through third sub-pixels SP1 through SP3 may respectively emit red, green, and blue light. The first through third sub-pixels SP1 to SP3 may emit other colors of light. The pixels P1 in the organic light-emitting display apparatuses 5 and 6 may have a stripe pixel structure.

Figure 5:
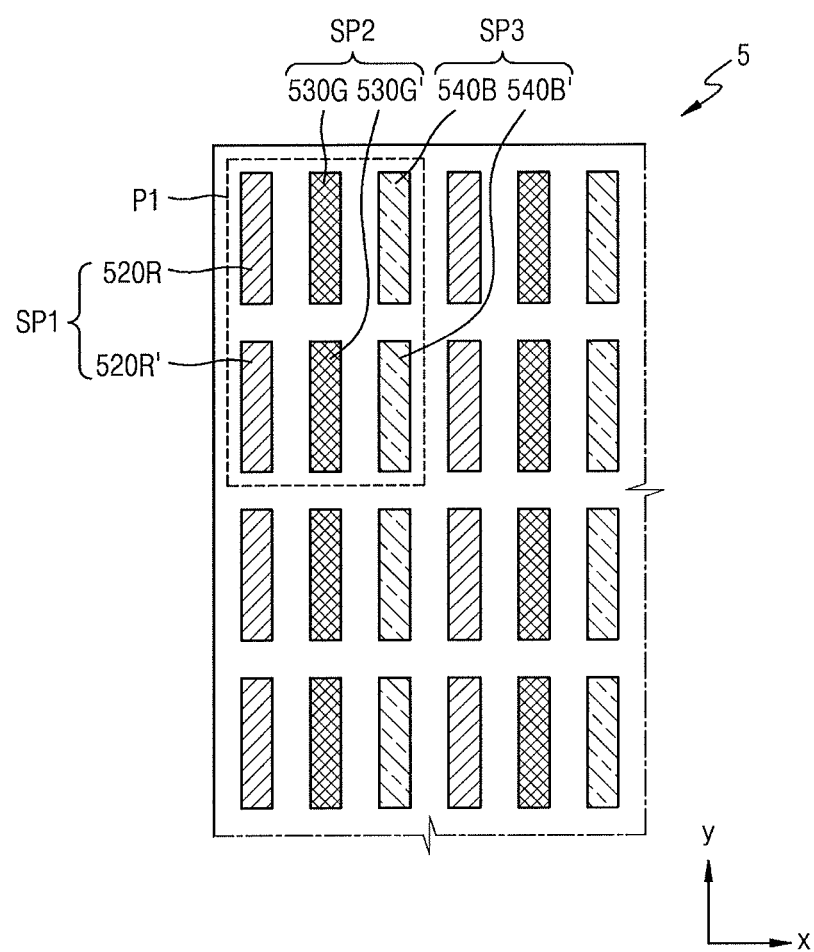
FIGS. 5 to 8 illustrate embodiments of pixel structures of organic light-emitting display apparatuses.

Referring to FIG. 5, each of the first to third sub-pixels SP1 to SP3 may include first OLEDs 520R, 530G, and 540B having a resonance structure and second OLEDs 520R', 530G', and 540B' having a non-resonance structure.

The pixels P1 are arranged in a matrix form. In one pixel P1, the first to third sub-pixels SP1 to SP3 may be arranged along a first direction, e.g., an x-axis direction. The first OLEDs 520R, 530G, and 540B and the second OLEDs 520R', 530G', and 540B' in each of the first to third sub-pixels SP1 to SP3 may be arranged along a second direction (e.g., a y-axis direction) perpendicular to the first direction.

Figure 6:
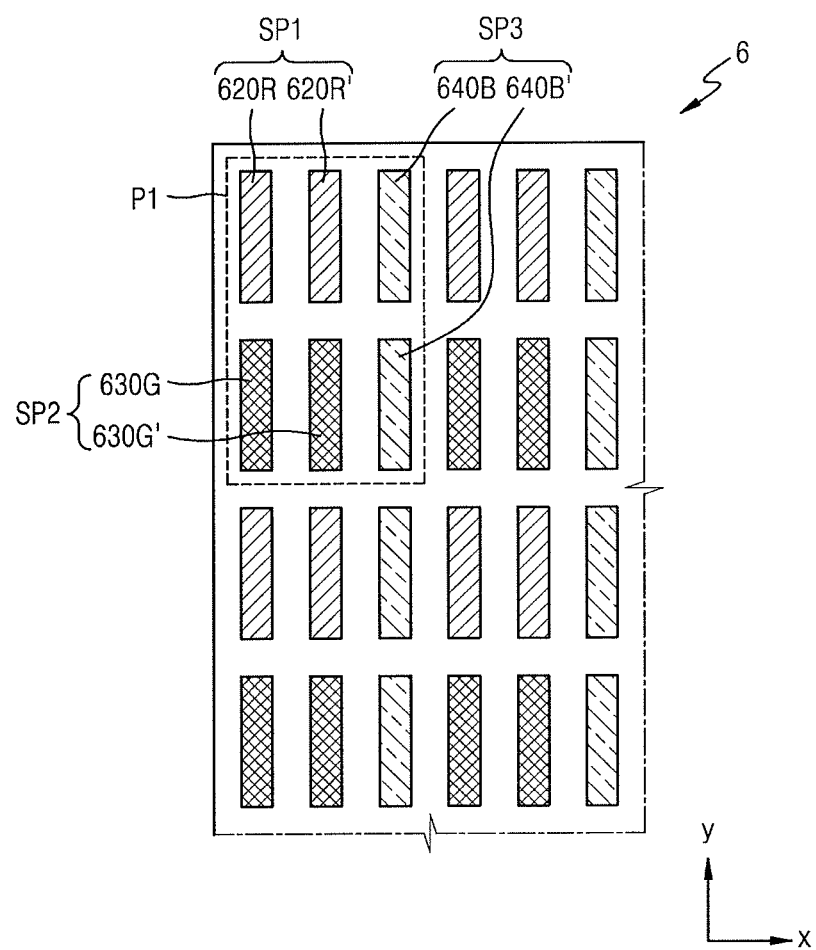

Referring to FIG. 6, each of the first to third sub-pixels SP1 to SP3 includes first OLEDs 620R, 630G, and 640B having a resonance structure and second OLEDs 620R', 630G', and 640B' having a non-resonance structure.

The pixels P are arranged in a matrix form. In one pixel P1, the first and second sub-pixels SP1 and SP2 may be arranged along the second direction, e.g., the y-axis direction. The third sub-pixel SP3 may be arranged in a region adjacent to the first and second sub-pixels SP1 and SP2 in the first direction, e.g., the x-axis direction. The first and second OLEDs 620R and 620R' in the first sub-pixel SP1 may be arranged along the first direction. The first and second OLEDs 620G and 620G' in the second sub-pixel SP2 may be arranged along the first direction. The first and second OLEDs 640B and 640B' in the third sub-pixel SP3 may be arranged along the second direction.

Figure 7:
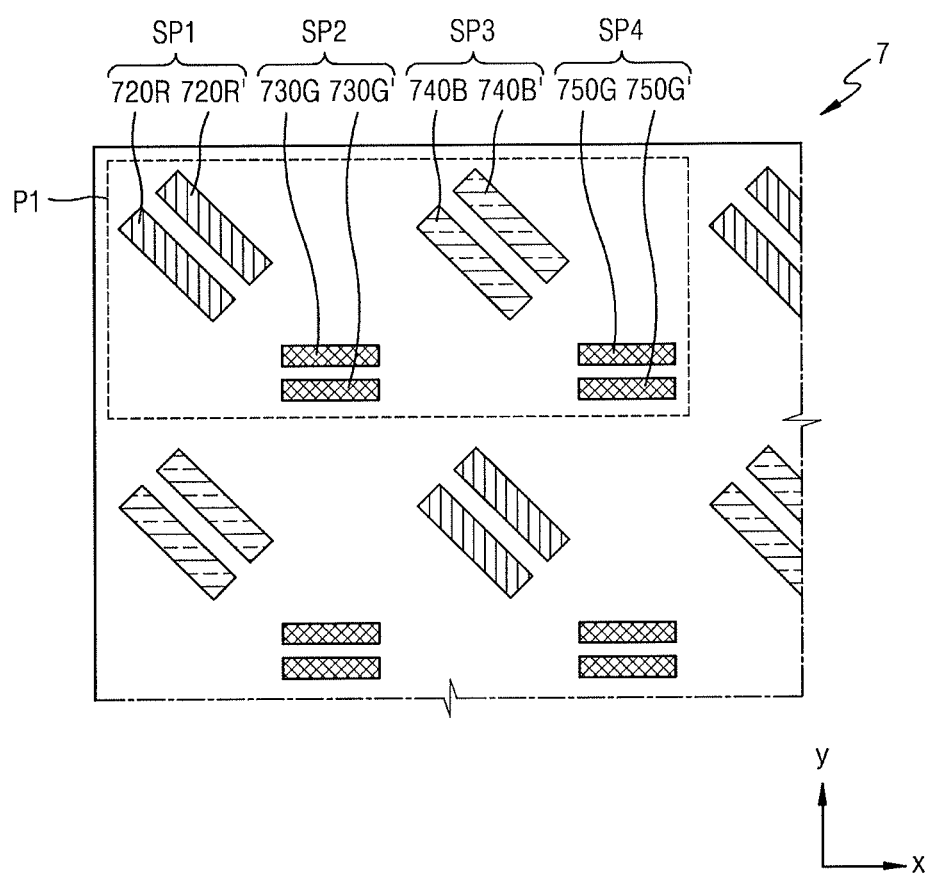
Figure 8:
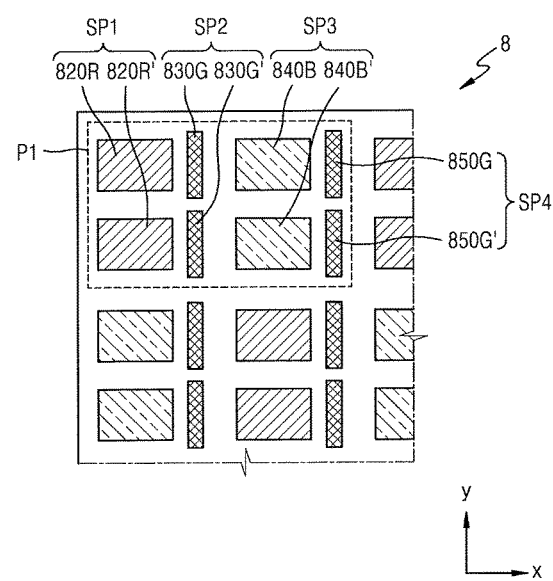

The organic light-emitting display apparatuses 7 and 8 of FIGS. 7 and 8 include the pixels P1, each of which may include the first to third sub-pixels SP1 to SP3 emitting different colors of light, and which may further include a fourth sub-pixel SP4 emitting the same color light as the second sub-pixel SP2. The organic light-emitting display apparatuses 7 and 8 may have, for example, a pentile pixel structure.

Referring to FIG. 7, each of the first to fourth sub-pixels SP1 to SP4 includes first OLEDs 720R, 730G, 740B, and 750G having a resonance structure and second OLEDs 720R', 730G', 740B', and 750G' having a non-resonance structure.

The first to fourth sub-pixels SP1 to SP4 are arranged along the first direction, e.g., the x-axis direction. The first and third sub-pixels SP1 and SP3 and the second and fourth sub-pixels SP2 and SP4 may be arranged in different rows. For example, the second sub-pixel SP2 may be spaced apart from the first sub-pixel SP1 at a predetermined interval not only in the first direction, but also in the second direction, e.g., the y-axis direction. Similarly, the fourth sub-pixel SP4 may be spaced apart from the third sub-pixel SP3 at a predetermined interval not only in the first direction but also in the second direction.

Referring to FIG. 8, each of the first to fourth sub-pixels SP1 to SP4 include first OLEDs 820R, 830G, 840B, and 850G having a resonance structure and second OLEDs 820R', 830G', 840B', and 850G' having a non-resonance structure.

The first to fourth sub-pixels SP1 to SP4 may be arranged along the first direction, e.g., the x-axis direction. Another pixel adjacent to the pixel P1 in the second direction (e.g., the y-axis direction) may include a third sub-pixel, a fourth sub-pixel, a first sub-pixel, and a second sub-pixel sequentially along the first direction.

According to an embodiment, the organic light-emitting display apparatuses 5 to 8 of FIGS. 5 to 8 may have the same or similar structure as those shown in FIGS. 1 to 4. In one embodiment, when each of a plurality of sub-pixels has a structure in which an OLED having a resonance structure and an OLED having a non-resonance structure are mixed, cross-sections of the organic light-emitting display apparatuses 5 to 8 of FIGS. 5 to 8 may have various forms.

Figure 9:
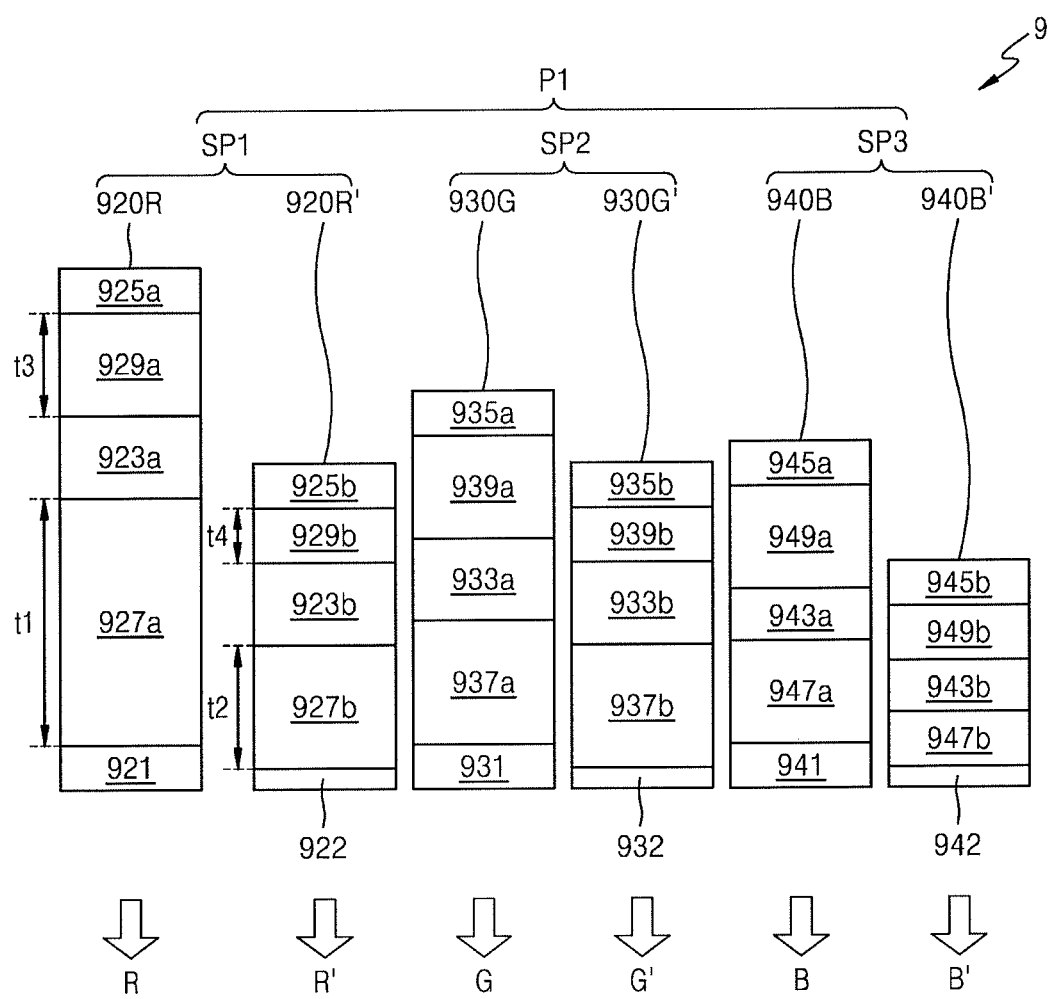
FIG. 9 illustrates an embodiment of a stacked structure of organic light-emitting devices.

FIG. 9 illustrates a cross-sectional view of an embodiment of a stacked structure of OLEDs in an organic light-emitting display apparatus 9. Referring to FIG. 9, the organic light-emitting display apparatus 9 may include the pixel P1 having the first to third sub-pixels SP1 to SP3. The first sub-pixel SP1 may include a first OLED 920R having a resonance structure and a second OLED 920R' having a non-resonance structure.

The first OLED 920R may include a first pixel electrode 921 including a semi-transmissive electrode, a first organic emission layer 923a on the first pixel electrode 921, and a first counter electrode 925a on the first organic emission layer 923a and including a reflective electrode. The second OLED 920R' may include a second pixel electrode 922 including a transparent electrode, a second organic emission layer 923b on the second pixel electrode 922, and a second counter electrode 925b on the second organic emission layer 923b and including a reflective electrode.

A first lower functional layer 927a may be between the first pixel electrode 921 and the first organic emission layer 923a. A second lower functional layer 927b may be between the second pixel electrode 922 and the second organic emission layer 923b. The first and second lower functional layers 927a and 927b may be, for example, a hole injection layer and/or a hole transport layer.

According to an embodiment, the thickness t1 of the first lower functional layer 927a may be different from the thickness t2 of the second lower functional layer 927b. The first OLED 920R is set such that the distance between the first pixel electrode 921 and the first counter electrode 925a satisfies a constructive interference condition, so as to increase light-extracting efficiency. The thickness t of the first lower functional layer 927a (e.g., the thickness of the hole injection layer, the hole transport layer, and/or another functional layer) may be adjusted to form a resonance structure between the first pixel electrode 921 and the first counter electrode 925a.

Since the second OLED 920R' does not include a resonance structure, the thickness t2 of the second lower functional layer 927b may not be adjusted together with the thickness t1 of the first lower functional layer 927a. For example, the thickness t2 of the second lower functional layer 927b may be arbitrarily set while considering a process condition and a function-enhancing condition.

A first upper functional layer 929a may be between the first organic emission layer 923a and the first counter electrode 925a. A second upper functional layer 929b may be between the second organic emission layer 923b and the second counter electrode 925b. For example, the first and second upper functional layers 929a and 929b may be an electron injection layer and/or an electron transport layer.

According to an embodiment, the thickness t3 of the first upper functional layer 929a may be different from a thickness t4 of the second upper functional layer 929b. The first OLED 920R is set such that the distance between the first pixel electrode 921 and the first counter electrode 925a satisfies a constructive interference condition, so as to increase light-extracting efficiency. The thickness t3 of the first lower functional layer 929a (e.g., the thickness of the electron injection layer, the electron transport layer, and/or another functional layer) may be adjusted such that a resonance structure is between the first pixel electrode 921 and the first counter electrode 925a.

Since the second OLED 920R' does not include a resonance structure, the thickness t4 of the second lower functional layer 929b may not be adjusted together with the thickness t3 of the first lower functional layer 929a. For example, the thickness t4 of the second lower functional layer 929b may be arbitrarily set while considering a process condition and a function-enhancing condition.

The organic light-emitting display apparatus 9 further includes the second and third sub-pixels SP2 and SP3, each of which includes first OLEDs 930G and 940B having a resonance structure and second OLEDs 930G' and 940B' having a non-resonance structure. Each of the first OLEDs 930G and 940B may include first pixel electrodes 931 and 941, first organic emission layers 933a and 943a, and first counter electrodes 935a and 945a. Each of the second OLEDs 930G' and 940B' may include second pixel electrodes 932 and 942, second organic emission layers 933b and 943b, and second counter electrodes 935b and 945b.

A first lower functional layer 937a and 947a may be between the first pixel electrodes 931 and 941 and the first organic emission layers 933a and 943a. A first upper functional layers 939a and 949a may be between the first organic emission layers 933a and 943a and the first counter electrodes 935a and 945a. Second lower function layers 937b and 947b may be between the second pixel electrodes 932 and 942 and the second organic emission layers 933b and 943b. Second upper functional layers 939b and 939b may be between the second organic emission layers 933b and 943b and the second counter electrodes 935b and 945b.

According to an embodiment, the thickness of the first lower functional layers 937a and 947a may be different from the thickness of the second lower functional layers 937b and 947b, and the thickness of the first upper functional layers 939a and 949a may be different from the thickness of the second upper functional layers 939b and 949b.

Also, since the first to third sub-pixels SP1 to SP3 emit different colors of light, the distance between the first pixel electrode 921 and the first counter electrodes 925a of the first sub-pixel SP1, the distance between the first pixel electrode 931 and the first counter electrode 935a of the second sub-pixel SP1, and the distance between the first pixel electrode 941 and the first counter electrode 945a of the third sub-pixel SP3 may be different from each other according to a wavelength of light to be externally emitted.

Figure 10:
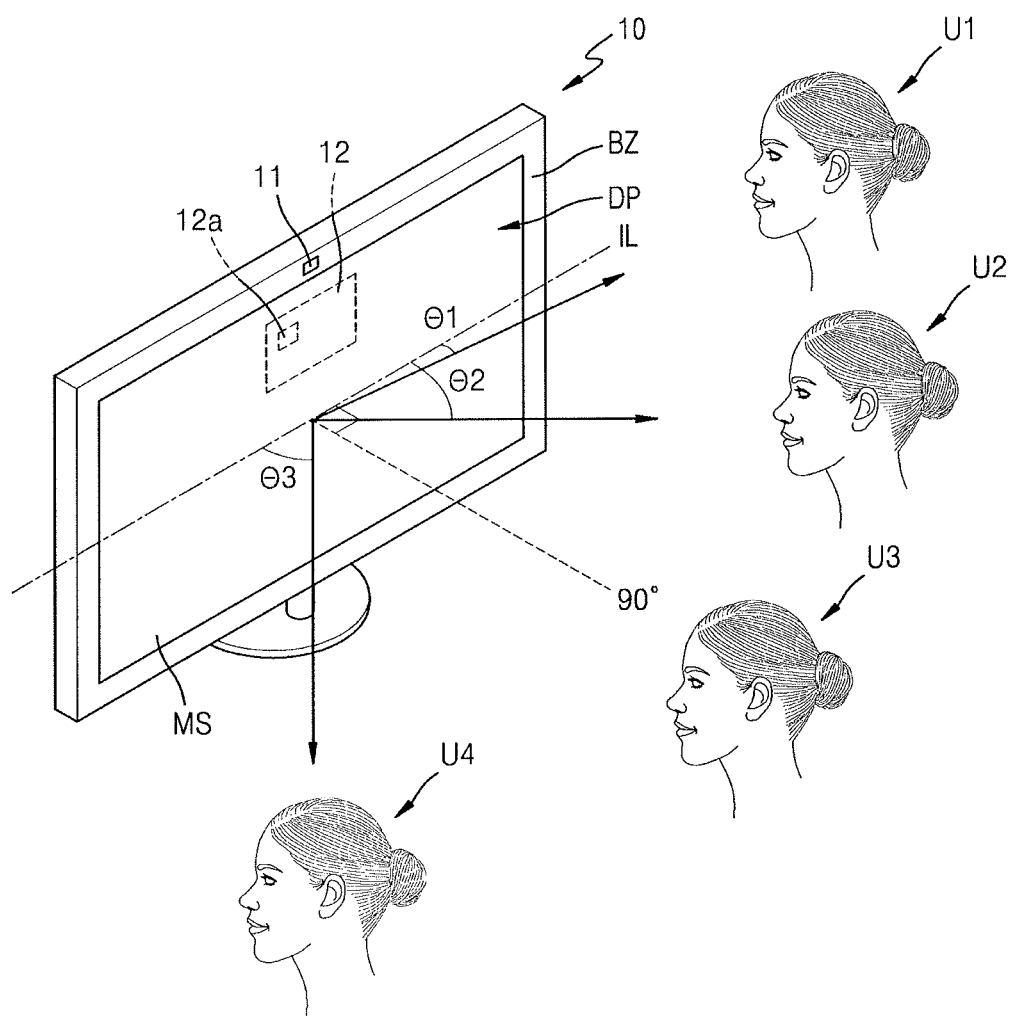
FIG. 10 illustrates an application example of an organic light-emitting display apparatus.
Figure 11:
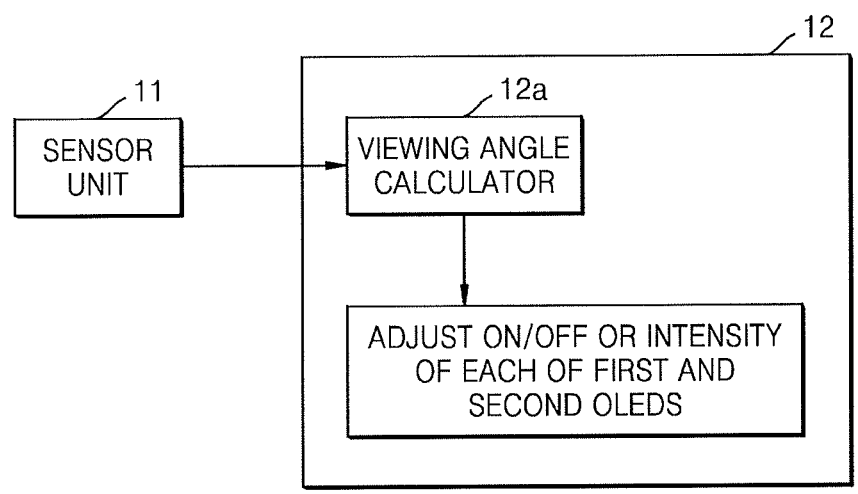
FIG. 11 illustrates an embodiment of a sensor unit and a controller.

FIG. 10 illustrates an application example of an organic light-emitting display apparatus 10 according to an embodiment. FIG. 11 illustrates an embodiment of a sensor unit 11 and a controller 12, which, for example, may be included in FIG. 10. FIGS. 12A through 12D are examples of graphs of luminance based on viewing angles of light emitted from an organic light-emitting display apparatus when a resonance structure and a non-resonance have certain luminance ratio.

Referring to FIGS. 10 and 11, the organic light-emitting display apparatus 10 includes the display panel DP including a main surface MS with the pixels P1 of FIG. 1 for displaying an image. Each of the pixels P1 includes the first to third sub-pixels SP1 to SP3 emitting different colors of light. Each of the first to third sub-pixels SP1 to SP3 includes the first OLED 120R of FIG. 1 having a resonance structure including a reflective electrode and a semi-transmissive electrode and the second OLED 120R' of FIG. 1 having a non-resonance structure including a reflective electrode and a transparent electrode. The first and second OLEDs 120R and 120R' are independently driven.

The organic light-emitting display apparatus 10 may further include the sensor unit 11, located outside the display panel DP, for detecting locations of first to fourth users U1 to U4. The controller 12 controls turning on/off or intensity of the first and second OLEDs 120R and 120R' in each of the first to third sub-pixels SP1 to SP3 based on locations of the first to fourth users U1 to U4 detected by the sensor unit 11.

The organic light-emitting display apparatus 10 includes a bezel BZ surrounding the display panel DP. In one embodiment, the viewing angle of a normal direction of the main surface MS may be 90° when the viewing angle of a direction parallel to a virtual line IL in the main surface MS of the display panel DP is 0°.

The controller 12 may include a viewing angle calculator 12a for calculating the viewing angle of the first to fourth users U1 to U4 with respect to the main surface MS based on the locations of the first to fourth users U1 to U4 detected by the sensor unit 11.

For example, when the first user U1 is looking at the organic light-emitting display apparatus 10, the sensor unit 11 detects the location of the first user U1 and the viewing angle calculator 12a calculates a first angle θ1 as a viewing angle based on the detected location of the first user U1. Similarly, the viewing angle calculator 12a may calculate a second angle θ2 as a viewing angle based on the location of the second user U2, calculate a third angle θ3 as a viewing angle based on the location of the fourth user U4, and calculate 90° as a viewing angle based on the location of the third user U3.

The controller 12 may control turning on/off and/or intensity of each of the first and second OLEDs 120R and 120R' based on the calculated viewing angles.

Figure 12A:
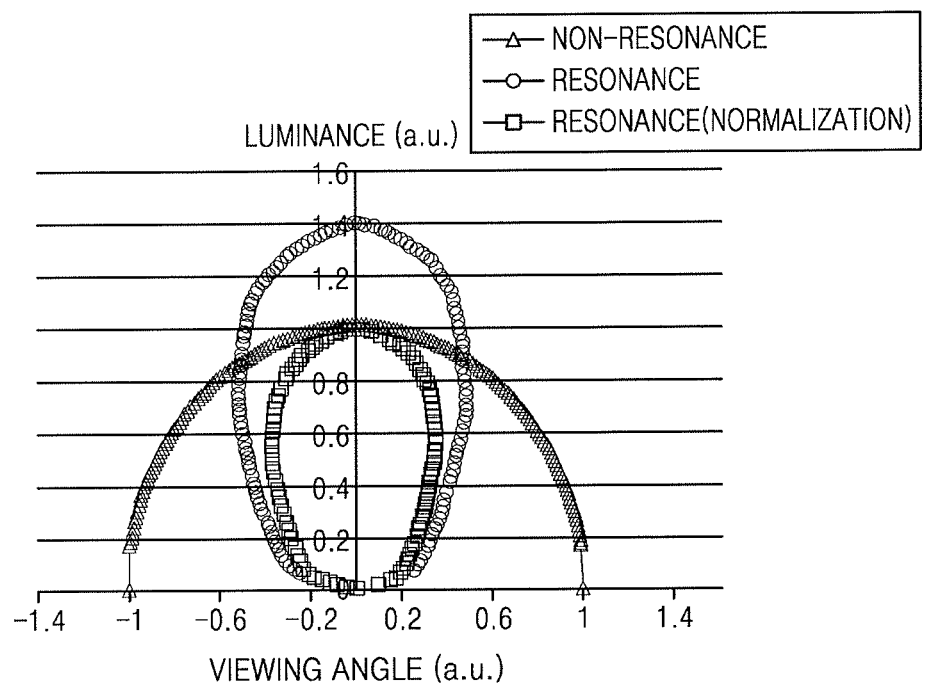
FIGS. 12A to 12D illustrate examples of luminance based on viewing angles of light emitted from an organic light-emitting display apparatus when a resonance structure and a non-resonance have certain luminance ratio.

FIG. 12A illustrates an example of a graph of luminance of light based on viewing angles when one pixel or sub-pixel includes only an OLED having a non-resonance structure or only an OLED having a resonance structure.

Referring to the graph of FIG. 12A, when an organic light-emitting display apparatus includes only an OLED having a non-resonance structure, a change in luminance based on the viewing angles is not large, but the luminance in the normal direction (90°) is relatively small compared to when an organic light-emitting display apparatus includes only an OLED having a resonance structure. The vertical axis of the graph indicates luminance in arbitrary units. When the organic light-emitting display apparatus includes only the OLED having a non-resonance structure, the luminance in the normal direction is normalized to 1.

For example, when the organic light-emitting display apparatus only includes the OLED having a resonance structure, the luminance in the normal direction may be about 1.4 times of that when the organic light-emitting display apparatus only includes the OLED having a non-resonance structure. However, luminance may rapidly decrease when the viewing angle decreases. FIG. 12A additionally illustrates a plot line, in which luminance based on viewing angles is normalized to 1 in the normal direction when the organic light-emitting display apparatus only includes the OLED having a resonance structure.

The horizontal axis of FIG. 12A indicates a viewing angle in arbitrary units, where a point indicated by 0 is a point where the normal direction (e.g., the viewing angle) is 90°. The viewing angle decreases as the number on the horizontal axis increases. In FIG. 12A, the luminance ratio at the viewing angle of 30° with respect to the luminance in the normal direction may be about 42%.

Figure 12B:
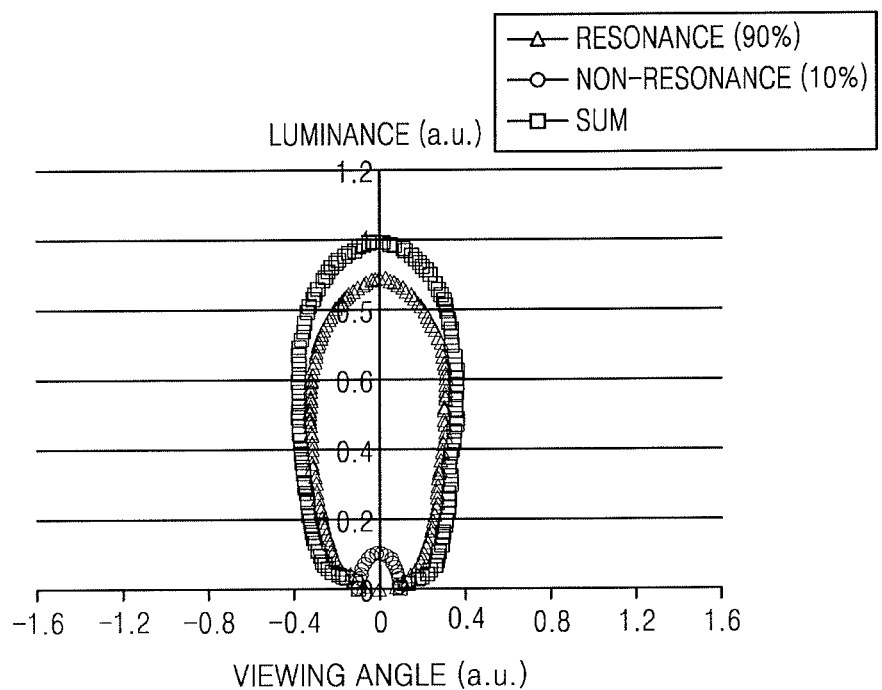

FIG. 12B illustrates an example of a graph of luminance according to viewing angles of each OLED and according to viewing angles of both OLEDs, where the luminance of an OLED having a resonance structure is adjusted to 90% and luminance of an OLED having a non-resonance structure is adjusted to 10%. In FIG. 12B, the luminance ratio at a viewing angle of 30° with respect to luminance in a normal direction may be about 48%.

Figure 12C:
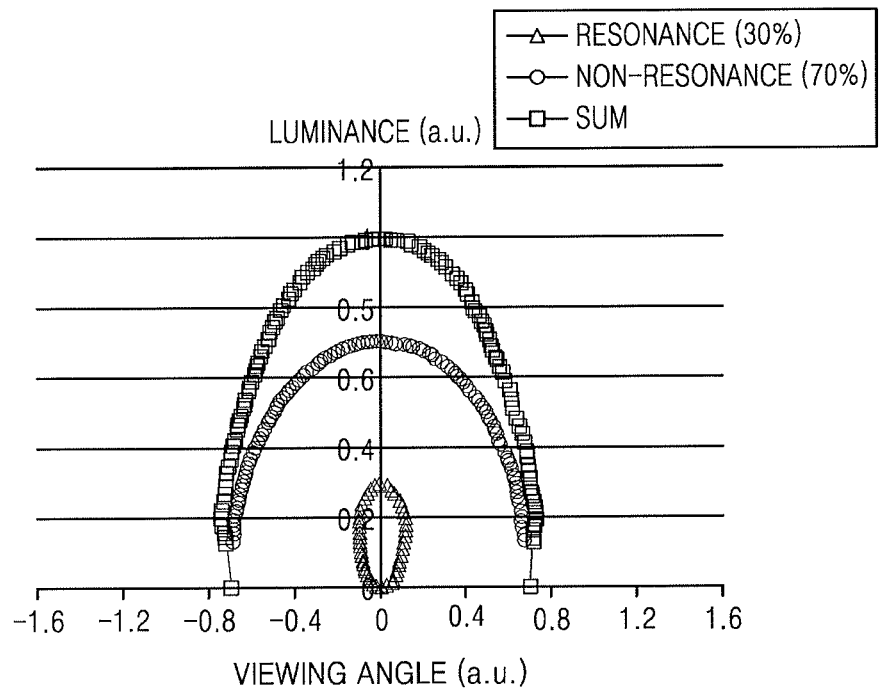

FIG. 12C illustrates an example of a graph of luminance according to viewing angles of each OLED and according to viewing angles of both OLEDs, where the luminance of an OLED having a resonance structure is adjusted to 30% and luminance of an OLED having a non-resonance structure is adjusted to 70%. In FIG. 12C, the luminance ratio at a viewing angle of 30° with respect to luminance in a normal direction may be about 83%.

Figure 12D:
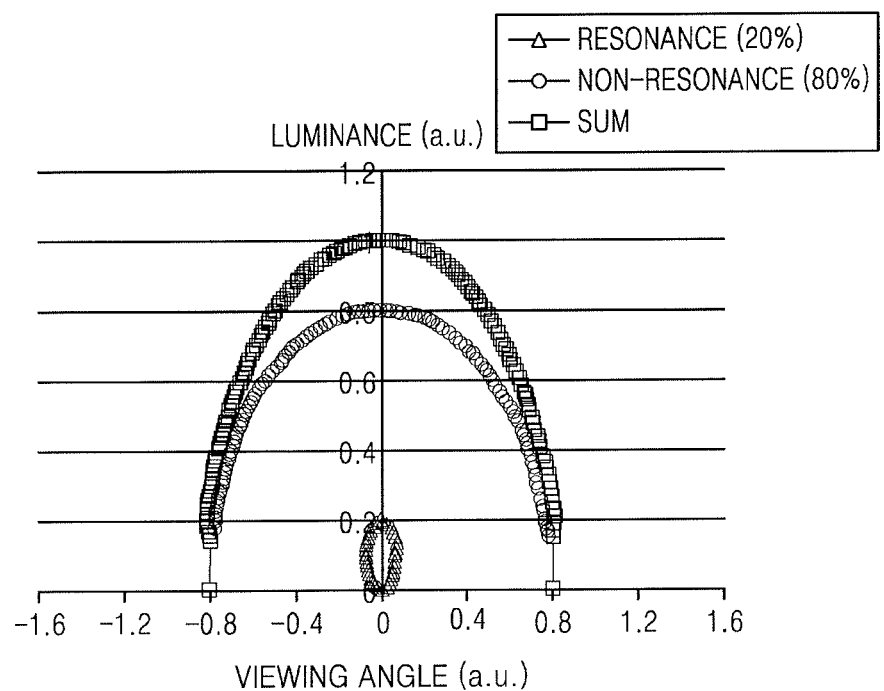

FIG. 12D illustrates an example of a graph of luminance according to viewing angle of each OLED and according to viewing angles of both OLEDs, where the luminance of an OLED having a resonance structure is adjusted to 20% and luminance of an OLED having a non-resonance structure is adjusted to 80%. In FIG. 12B, a luminance ratio at a viewing angle of 30° with respect to luminance in a normal direction may be about 88%.

As shown in the graphs of FIGS. 12B to 12D, the luminance according to viewing angles decreases when the luminance ratio of the OLED having a non-resonance structure increases. Meanwhile, in FIGS. 12B to 12D, the luminance in the normal direction is normalized to 1 when the luminance of the OLED having a resonance structure and the luminance of the OLED having a non-resonance structure are added. Under some circumstances, the luminance in the normal direction may increase when a rate of the OLED having a resonance structure increases.

The luminance ratio of the first OLED 120R having a resonance structure and the second OLED 120R' having a non-resonance structure may be adjusted by adjusting the numbers of first and second OLEDs 120R and 120R' in each of the pixels or sub-pixels. Also, the luminance ratio may be adjusted by adjusting the intensity of the first OLED 120R and the intensity of the second OLED 120R'. The luminance ratio may be adjusted by adjusting both of the numbers and intensities. Such adjustment is possible because the first and second OLEDs 120R and 120R' are independently driven.

For example, when the third user U3 of FIG. 10 is looking at the organic light-emitting display apparatus 10, the luminance of the first OLED 120R having a resonance structure may be increased as shown in FIG. 12B. And, when the first user U1 is looking at the organic light-emitting display apparatus 10, the luminance of the second OLED 120R' having a non-resonance structure may be increased as shown in FIG. 12D.

For example, the controller 12 may control the first and second OLEDs 120R and 120R' such that the intensity of light emitted from the first OLED 120R is greater than that from the second OLED 120R' when the viewing angle is high, e.g., above a predetermined reference value. Also, the controller 12 may control the first and second OLEDs 120R and 120R' such that the number of second OLED 120R' turned on is greater than that of the first OLED 120R turned on when the viewing angle is high, e.g., above a predetermined reference value.

In accordance with one or more of the aforementioned embodiments, an organic light-emitting display apparatus may have low luminance deterioration based on viewing angles and low color shift because one pixel or sub-pixel includes both resonance and non-resonance structures. Also, an image in an optimized state may be displayed to a user by variously adjusting a ratio of luminance of light emitted from a resonance structure and luminance of light emitted from a non-resonance structure based on viewing angles of the user.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An organic light-emitting display apparatus, comprising:
   a display panel including a main surface where an image is displayed based on light from a plurality of pixels, wherein each of the pixels includes:
   a first driver and a second driver;
   a first organic light-emitting device electrically connected to the first driver, the first organic light-emitting device including a first pixel electrode, a first organic emission layer on the first pixel electrode, and a first counter electrode on the first organic emission layer; and
   a second organic light-emitting device electrically connected to the second driver, the second organic light-emitting device including a second pixel electrode, a second organic emission layer on the second pixel electrode and to emit a same color light as the first organic emission layer, and a second counter electrode on the second organic emission layer, wherein one of the first pixel electrode and the first counter electrode is a reflective electrode and another one is a semi-transmissive electrode, and wherein one of the second pixel electrode and the second counter electrode is a reflective electrode and another one is a transparent electrode.

2. The organic light-emitting display apparatus as claimed in claim 1, wherein:
   the first counter electrode and the second counter electrode are reflective electrodes, the first pixel electrode is a semi-transmissive electrode including a transparent conductive layer and a semi-transmissive metal layer, and the second pixel electrode is a transparent electrode including a transparent conductive layer.

3. The organic light-emitting display apparatus as claimed in claim 1, wherein:

the first pixel electrode and the second pixel electrode are reflective electrodes, the first counter electrode is a semi-transmissive electrode including a transparent conductive layer and a semi-transmissive metal layer, and the second counter electrode is a transparent electrode including a transparent conductive layer.

4. The organic light-emitting display apparatus as claimed in claim 3, wherein:

the transparent conductive layer is shared by the first counter electrode and the second counter electrode, and the semi-transmissive metal layer is in the first counter electrode and not in the second counter electrode.

5. The organic light-emitting display apparatus as claimed in claim 1, wherein the first organic light-emitting device and the second organic light-emitting device are to be independently driven by the first driver and the second driver, respectively.

6. The organic light-emitting display apparatus as claimed in claim 1, further comprising:

a sensor, outside the display panel, to detect a location of a user; and a controller to control turning on/off or intensity of each of the first organic light-emitting device and the second organic light-emitting device in each of the plurality of pixels, based on the location of the user detected by the sensor.

7. The organic light-emitting display apparatus as claimed in claim 6, wherein the controller includes a viewing angle calculator to calculate a viewing angle of the user with respect to the main surface based on the location of the user detected by the sensor.

8. The organic light-emitting display apparatus as claimed in claim 7, wherein the controller is to control the first and second organic light-emitting devices such that intensity of light emitted from the first organic light-emitting device is greater than that from the second organic light-emitting device when the viewing angle is above a predetermined reference value.

9. The organic light-emitting display apparatus as claimed in claim 7, wherein the controller is to control the first and second organic light-emitting devices such that a number of first organic light-emitting devices that are turned on is greater than a number of second organic light-emitting devices when the viewing angle is above a predetermined reference value.

10. The organic light-emitting display apparatus as claimed in claim 1, further comprising:

a first lower functional layer between the first pixel electrode and the first organic emission layer; and a second lower functional layer between the second pixel electrode and the second organic emission layer, wherein thicknesses of the first lower functional layer and the second lower functional layer are different from each other.

11. The organic light-emitting display apparatus as claimed in claim 1, further comprising:

a first upper functional layer between the first organic emission layer and the first counter electrode; and a second upper functional layer between the second organic emission layer and the second counter electrode, wherein thicknesses of the first upper functional layer and the second upper functional layer are different from each other.

12. An organic light-emitting display apparatus, comprising:

a display panel including a main surface where an image is displayed based on light emitted from a plurality of pixels, wherein each of the pixels includes a plurality of sub-pixels to emit different colors of light, each of the sub-pixels including:

a first organic light-emitting device having a resonance structure including a reflective electrode and a semi-transmissive electrode; and a second organic light-emitting device having a non-resonance structure including a reflective electrode and a transparent electrode, and the first organic light-emitting device and the second organic light-emitting device are to be independently driven.

13. The organic light-emitting display apparatus as claimed in claim 12, wherein the first organic light-emitting device and the second organic light-emitting device respectively include a first organic light emission layer and a second organic emission layer to emit a same color light.

14. The organic light-emitting display apparatus as claimed in claim 12, further comprising:

a sensor, outside the display panel, to detect a location of a user; and a controller to control turning on/off or intensity of each of the first organic light-emitting device and the second organic light-emitting device in each of the plurality of sub-pixels, based on the location of the user detected by the sensor.

15. The organic light-emitting display apparatus as claimed in claim 14, wherein the controller includes a viewing angle calculator to calculate a viewing angle of the user with respect to the main surface based on the location of the user detected by the sensor.

16. The organic light-emitting display apparatus as claimed in claim 15, wherein the controller is to control the first and second organic light-emitting devices such that intensity of light emitted from the first organic light-emitting device is greater than that from the second organic light-emitting device when the viewing angle is above a predetermined reference value.

17. The organic light-emitting display apparatus as claimed in claim 15, wherein the controller is to control the first and second organic light-emitting devices such that a number of first organic light-emitting devices that are turned on is greater than a number of second organic light-emitting devices when the viewing angle is above a predetermined reference value.

18. An apparatus, comprising:

a pixel comprising:

a first light emitter having a resonance structure; and a second light emitter having a non-resonance structure, wherein the first light emitter and the second light emitter are to emit light of a same color, and wherein the first light emitter and the second light emitter are to be independently driven based on different signals from different drivers.

19. The apparatus as claimed in claim 18, wherein:

the resonance structure includes a reflective electrode and a semi-transmissive electrode and the non-resonance structure includes a reflective electrode and a transparent electrode.

\* \* \* \* \*